US012648131B2

(12) United States Patent
Peng et al.

(10) Patent No.: US 12,648,131 B2
(45) Date of Patent: Jun. 2, 2026

(54) DYNAMIC RANDOM ACCESS MEMORY AND MANUFACTURING METHOD THEREOF

(71) Applicant: Winbond Electronics Corp., Taichung City (TW)

(72) Inventors: Te-Hsuan Peng, Taichung City (TW); Keng-Ping Lin, Taichung City (TW)

(73) Assignee: Winbond Electronics Corp., Taichung City (TW)

( * ) Notice: Subject to any disclaimer, the term of this patent is extended or adjusted under 35 U.S.C. 154(b) by 414 days.

(21) Appl. No.: 18/327,842

(22) Filed: Jun. 1, 2023

(65) Prior Publication Data

US 2024/0334685 A1 Oct. 3, 2024

(30) Foreign Application Priority Data

Mar. 30, 2023 (TW) ................................. 112112365

(51) Int. Cl.
*H10B 12/00* (2023.01)
(52) U.S. Cl.
CPC ........... *H10B 12/488* (2023.02); *H10B 12/02* (2023.02); *H10B 12/482* (2023.02); *H10B 12/485* (2023.02)

(58) Field of Classification Search
CPC .... H10B 12/488; H10B 12/02; H10B 12/482; H10B 12/485; H10B 12/0335; H10B 12/315; H10B 12/033; H10B 12/312; G11C 11/419
See application file for complete search history.

(56) References Cited

U.S. PATENT DOCUMENTS

| | | | |
|---|---|---|---|
| 9,184,091 B2 | 11/2015 | Song et al. | |
| 10,770,464 B2 | 9/2020 | Liu et al. | |
| 11,239,111 B1 | 2/2022 | Huang et al. | |
| 2016/0043171 A1* | 2/2016 | Jang | H10D 62/116 |
| | | | 257/330 |
| 2018/0012894 A1* | 1/2018 | Kim | H10B 12/315 |
| 2019/0067294 A1* | 2/2019 | Lee | H10B 12/315 |
| 2020/0020697 A1* | 1/2020 | Kim | H10B 12/0335 |
| 2023/0066310 A1* | 3/2023 | Hung | H10B 43/27 |

* cited by examiner

*Primary Examiner* — Yasser A Abdelaziez
(74) *Attorney, Agent, or Firm* — JCIPRNET

(57) ABSTRACT

Provided are a dynamic random access memory and a method for manufacturing the same. The DRAM includes: a plurality of word line structures, located in a substrate; a plurality of bit line structures, located above the substrate, crossing over the plurality of word line structures; a plurality of node contacts, each of which being located between adjacent two of the word line structures and adjacent two of the bit line structures; and a plurality of first spacers, separating the plurality of node contacts. Each of the plurality of first spacers further comprises: spacer material, filled in a gap between the node contacts that are adjacent; and a first cap layer, embedded in the spacer material.

15 Claims, 9 Drawing Sheets

DYNAMIC RANDOM ACCESS MEMORY AND MANUFACTURING METHOD THEREOF

CROSS-REFERENCE TO RELATED APPLICATION

This application claims the priority benefit of Taiwan application serial no. 112112365, filed on Mar. 30, 2023. The entirety of the above-mentioned patent application is hereby incorporated by reference herein and made a part of this specification.

BACKGROUND

Technical Field

The disclosure relates to an integrated circuit and a manufacturing method thereof, particularly to a dynamic random access memory and a manufacturing method therefore.

Description of Related Art

With the rapid advancement of technology, in order to meet consumers' demand for smaller electronic devices, the size of dynamic random access memory (DRAM) designs continues to shrink and move towards higher integration. However, as the device size continues to decrease, it becomes increasingly difficult to fill materials into openings or holes, which may result in the formation of seams and abnormal bridging when conductors are subsequently filled into these seams. On the other hand, abnormal bridging may also occur due to other factors.

SUMMARY

This disclosure provides a dynamic random access memory and a manufacturing method thereof, which can avoid bridging caused by conductor filling into seams.

According to one embodiment of the present disclosure, a dynamic random access memory is provided. The dynamic random access memory comprises a plurality of word line structures, a plurality of bit line structures, a plurality of node contacts, and a plurality of first spacers. The plurality of word line structures are located in a substrate. The plurality of bit line structures are located over the substrate and span over the plurality of word line structures. Each of the plurality of node contact is located between adjacent two of the word line structures and adjacent two of the bit line structures. The plurality of first spacers are located on sidewalls of the node contact. The plurality of first spacers separate the plurality of node contacts. Each of the plurality of first spacers further comprises spacer material and a first cap layer. The spacer material is filled in a gap between the node contacts that are adjacent. The first cap layer is embedded in the spacer material.

According to another embodiment of the present disclosure, a method for manufacturing a dynamic random access memory is provided. The method comprises the following steps. A plurality of word line structures are formed in a substrate. A plurality of bit line structures are formed over the substrate. A plurality of node contact materials are formed, wherein each of the plurality of node contact material is located between adjacent two of the word line structures and adjacent two of the bit line structures. A plurality of spacer materials are formed between the plurality of node contact materials, wherein the plurality of spacer materials have a plurality of seams. A removal step is performed to remove a portion of the plurality of spacer materials to expose the plurality of seams. A plurality of first cap layers are formed in the plurality of seams, wherein the remained plurality of spacer materials forms a plurality of first spacers, and the plurality of first cap layers are embedded in the plurality of first spacers. A portion of the plurality of node contact materials is removed to form a plurality of node contacts.

Based on the above descriptions, in the embodiment of the present disclosure, the sealed opening of the seam is opened and then the opening of the seam is sealed by a cap layer. Therefore, it may prevent the bridging caused by the conductor filling the seam.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Referring to FIGS. 2A to 4A, a substrate 100 is provided. The substrate 100 may be a semiconductor material, such as silicon or other suitable materials. The substrate 100 comprises a memory cell region MR and an end region ER. The end region ER is located at the end of the memory cell region MR. Isolation structures SI are formed in the memory cell region MR and the end region ER of the substrate 100. The material of the isolation structures SI comprises silicon oxide, silicon nitride, or their combination. The isolation structures SI define active areas AA in the substrate 100 corresponding to the memory cell region MR, as shown in FIG. 1.

Figure 1:
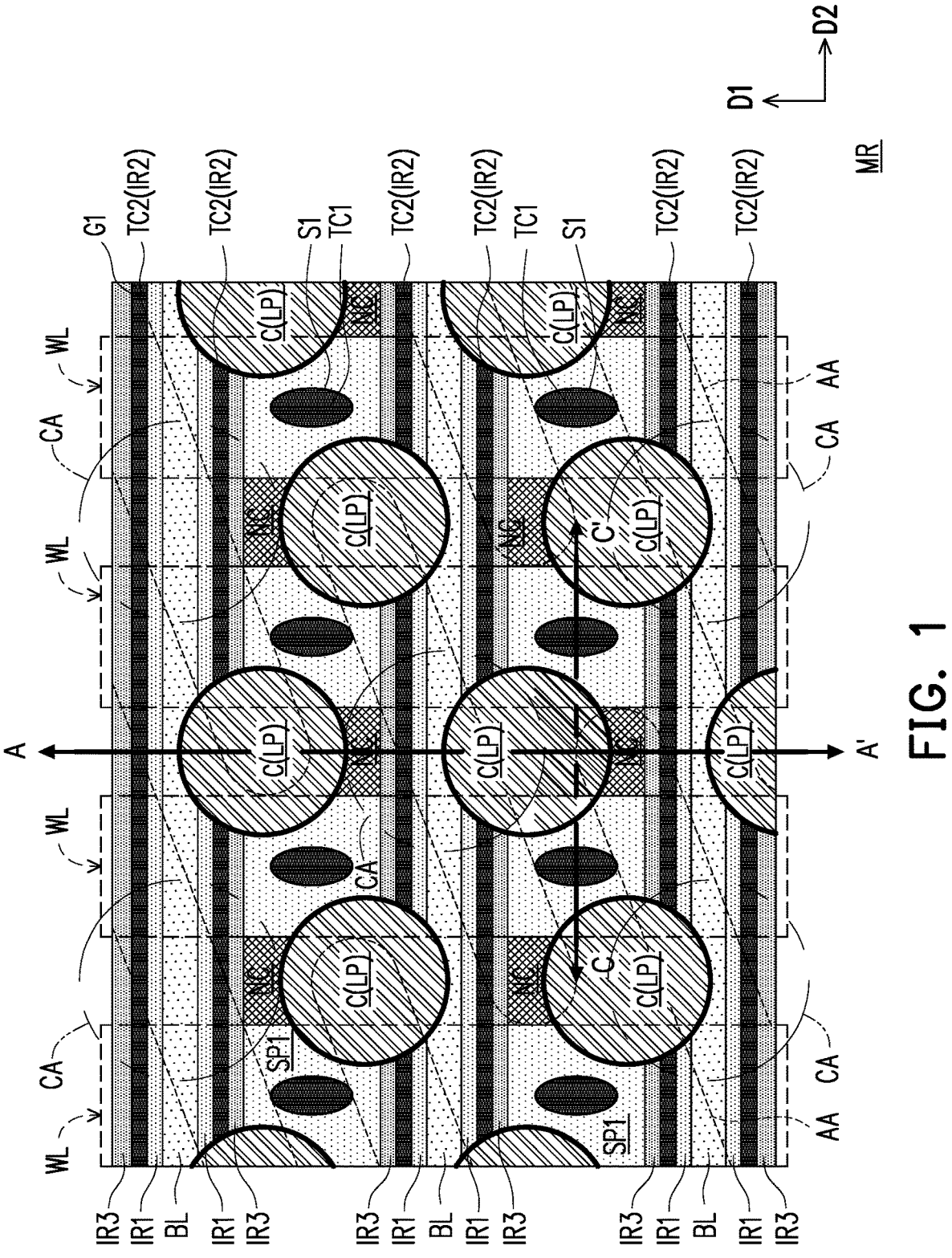
FIG. 1 is a top view of a memory unit area of a dynamic random access memory according to an embodiment of the present disclosure.
Figures 2A, 3A, 4A:
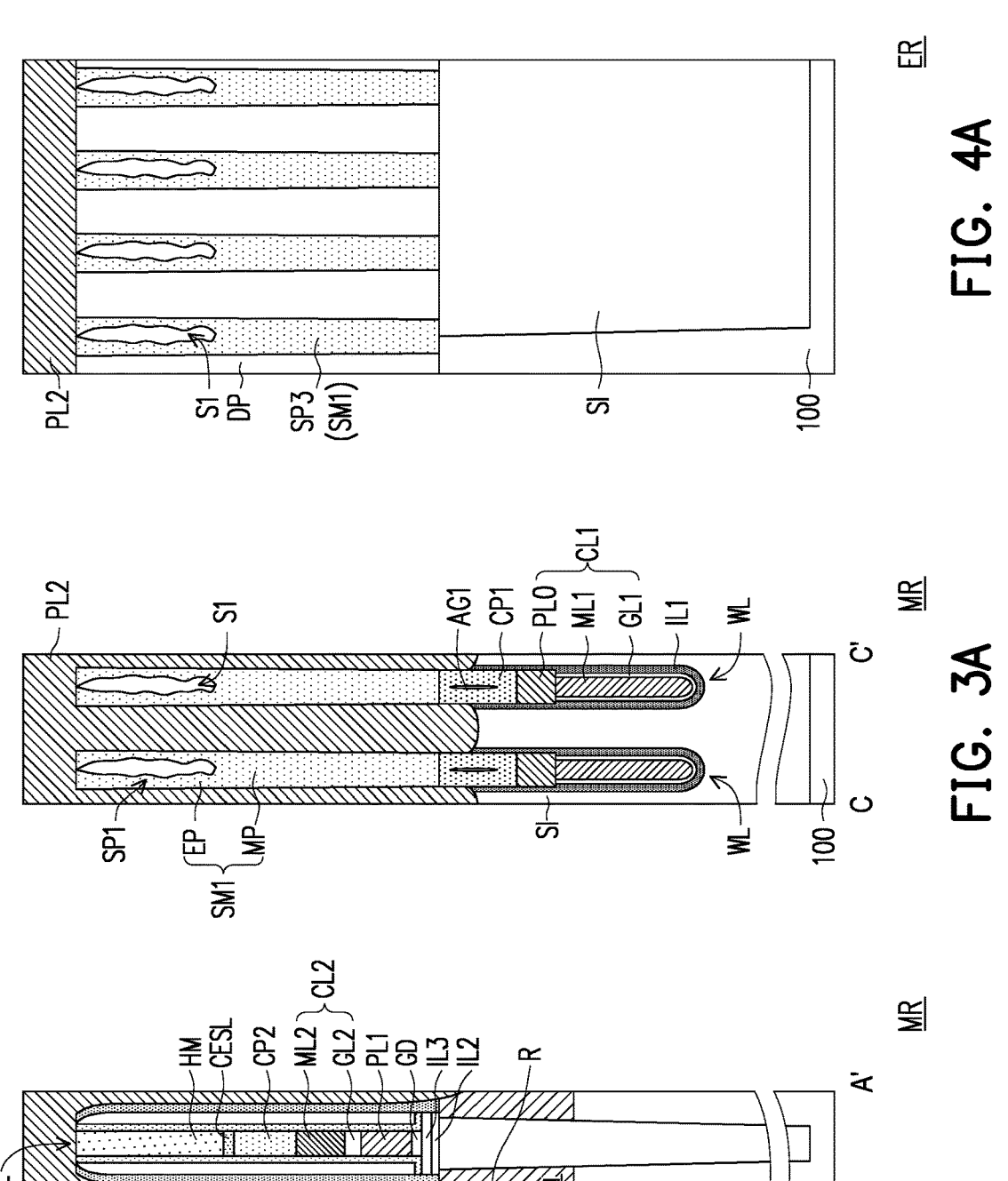
FIGS. 2A to 2H are schematic sectional views of a manufacturing process of the dynamic random access memory taken along the line A-A' of FIG. 1.
FIGS. 3A to 3H are schematic sectional views of a manufacturing process of the dynamic random access memory taken along the line C-C' of FIG. 1.
FIGS. 4A to 4H are schematic sectional views of a manufacturing process of the end portion of the dynamic random access memory.

Referring to FIGS. 1, 2A, and 3A, word line structures WL are formed in the substrate 100 in the memory cell region MR. The word line structures WL pass through the substrate 100 and are arranged in the direction D2, extending in the direction D1 and passing through the active area AA and the plurality of isolation structures SI. Each word line structure WL may comprise an insulating layer IL1, a conductor layer CL1, and a cap layer CP1. The insulating layer IL1 may serve as a gate dielectric layer and surround the conductor layer CL1 and the cap layer CP1. The insulating layer IL1 may be, for example, silicon oxide. The conductor layer CL1 may comprises a metal layer ML1 and an adhesive layer GL1, or optionally further comprise a semiconductor layer PL0. The adhesive layer GL1 is located between the metal layer ML1 and the insulating layer IL1. The metal layer ML1 may be, for example, tungsten, and the adhesive layer GL1 may be titanium, titanium nitride, tantalum, niobium nitride, or a combination thereof. The semiconductor layer PL0 covers the conductor layer CL1 and may be, for example, polysilicon. The cap layer CP1 covers the semiconductor layer PL0 and may be, for example, silicon nitride. The cap layer CP1 may have air gaps AG1 therein.

Referring to FIG. 2A, an insulating layer IL2 is formed on the substrate 100 and the plurality of isolation structures SI. The insulating layer IL2, for example, is a layer of silicon dioxide. A doped region DR1 is formed in the active area AA of the substrate 100. The doped region DR1 can serve as a source or drain region. The substrate 100, for example, has a first conductivity type dopant, and the doped region DR1 has a second conductivity type dopant. In some embodiments, the first conductivity type dopant is a P-type dopant, and the second conductivity type dopant is an N-type dopant. The P-type dopants, for example, comprise boron, and the N-type dopants comprise phosphorus or arsenic.

Referring to FIGS. 1 and 2A, bit line structures BL and bit line contact windows CA are formed on the substrate 100. The method of forming the plurality of bit line structures BL and bit line contact windows CA is described as follows. An insulating layer IL3 is formed on substrate 100. The insulating layer IL3, for example, is a silicon nitride layer. Next, a dielectric layer GD and a semiconductor layer PL1 are formed on the substrate 100. The dielectric layer GD, for example, is an oxide layer or a high dielectric constant material. The semiconductor layer PL1, for example, is doped polysilicon. Then, a bit line plug (not shown) is formed. The bit line plug is subsequently patterned into a bit line contact window CA, which penetrates through the semiconductor layer PL1, the dielectric layer GD and the insulating layers IL3 and IL2, and extends into substrate 100 to connect with the doped region DR1. The bit line plug comprises doped polysilicon or metal.

After forming the bit line plug, a barrier layer GL2, a metal layer ML2, a cap layer CP2, an etch stop layer CESL, and a hard mask layer HM are formed above the substrate 100. The material of the barrier layer GL2 may be titanium, titanium nitride, tantalum, tantalum nitride, tungsten silicide (WSi), tungsten nitride (WN), or a combination thereof. The metal layer ML2 may be a metal or a metal silicide, such as tungsten, tungsten silicide, cobalt silicide, or a combination thereof. The cap layer CP2 may be silicon nitride. The etch stop layer CESL may be silicon nitride. The hard mask layer HM may be silicon nitride.

By the lithography and etching processes, the aforementioned layers are patterned to form bit line structures (BL), while simultaneously patterning the bit line plugs to form the bit line contact windows (CA). The bit line structures (BL) are arranged in the direction D1 and extend in the direction D2. The barrier layer (GL2) and the metal layer (ML2) in the bit line structure (BL) form the conductor layer (CL2) of the bit line. The conductor layer (CL2) of the bit line is electrically connected to the doped region (DR1) through the bit line contact window (CA). During the process of etching the semiconductor layers (PL1) and the bit line plugs, some of the bit line plug are removed, so as to form grooves (R) on both sides of the bit line contact window (CA).

After forming the bit line structures BL and the contact windows CA, a filling layer FL is formed in each groove R, and spacers SP2 are formed on the sidewalls of the bit line structure BL. The spacer SP2 may comprise a liner layer (also referring to an inner liner layer) IR1, a middle liner layer IR2, and a liner layer (also referring to an outer liner layer) IR3. The liner layer IR1 is located on the sidewall of the bit line structure BL. The liner layer IR1 also extends to cover the bottom and sidewalls of the filling layer FL. The middle liner layer IR2 is located on the sidewall of the liner layer IR1 and is sandwiched between the liner layers IR1 and IR3. The liner layers IR1 and IR3, for example, are silicon nitride or silicon oxynitride. The middle liner layer IR2, for example, is silicon oxide. The filling layer FL, for example, is silicon nitride. The method of forming the liner layers IR1 and IR2 and the filling layer FL is described as follows. The liner layer IR1 is formed on the substrate 100. Next, the filling layer FL is formed in the groove R by deposition and anisotropic etching processes. Then, the middle liner layer IR2 is formed on the substrate 100. After that, an anisotropic etching process is performed on the middle liner layer IR2 and the liner layer IR1. Then, the liner layer IR3 is formed on the substrate 100. Finally, an etching back process is performed to expose the hard mask layer HM and the doped region DR1 in the substrate 100.

Subsequently, dielectric pillars DP and spacers SP3 are formed on the substrate 100 in the end region ER, and spacers SP1 are formed over the word line structures WL. The method of forming the dielectric pillars DP and the spacers SP1, SP3 is described as follows.

A dielectric layer (not shown) is formed on the substrate 100. The material of the dielectric layer is different from that of the liner layer IR3. Examples of materials for the dielectric layer comprise spin-on glass and silicon oxide, etc. Then, the dielectric layer is patterned to form an opening (not shown) in the dielectric layer in the memory cell region MR and to form the dielectric pillars DP in the end region ER. Next, a spacer material SM1 is formed on the substrate 100. Examples of spacer material SM1 comprise silicon nitride. Then, an etching back process or planarization process is performed to remove the spacer material SM1 on the dielectric layer, forming a spacer SP1 in the memory cell region MR and a spacer SP3 in the end region ER. Next, the dielectric layer in the memory cell region MR is removed. The spacer material SM1 has a seam S1 therein. The spacer material SM1 may include a main portion MP and an extension portion EP. The extension portion EP is located on the main portion MP and connected to the main portion MP. The seam S1 is located in the extension portion EP. The seam S1 is a closed or open space. The seam S1 may have an irregular shape, for example.

Referring to FIGS. 2A to 4A, a node contact material PL2 is formed on the substrate 100. The node contact material PL2 is also filled between the spacers SP1 and between the bit line structures BL, and is electrically connected to the doped region DR1. The node contact material PL2 may be a semiconductor, such as polysilicon.

Figures 2B, 3B, 4B:
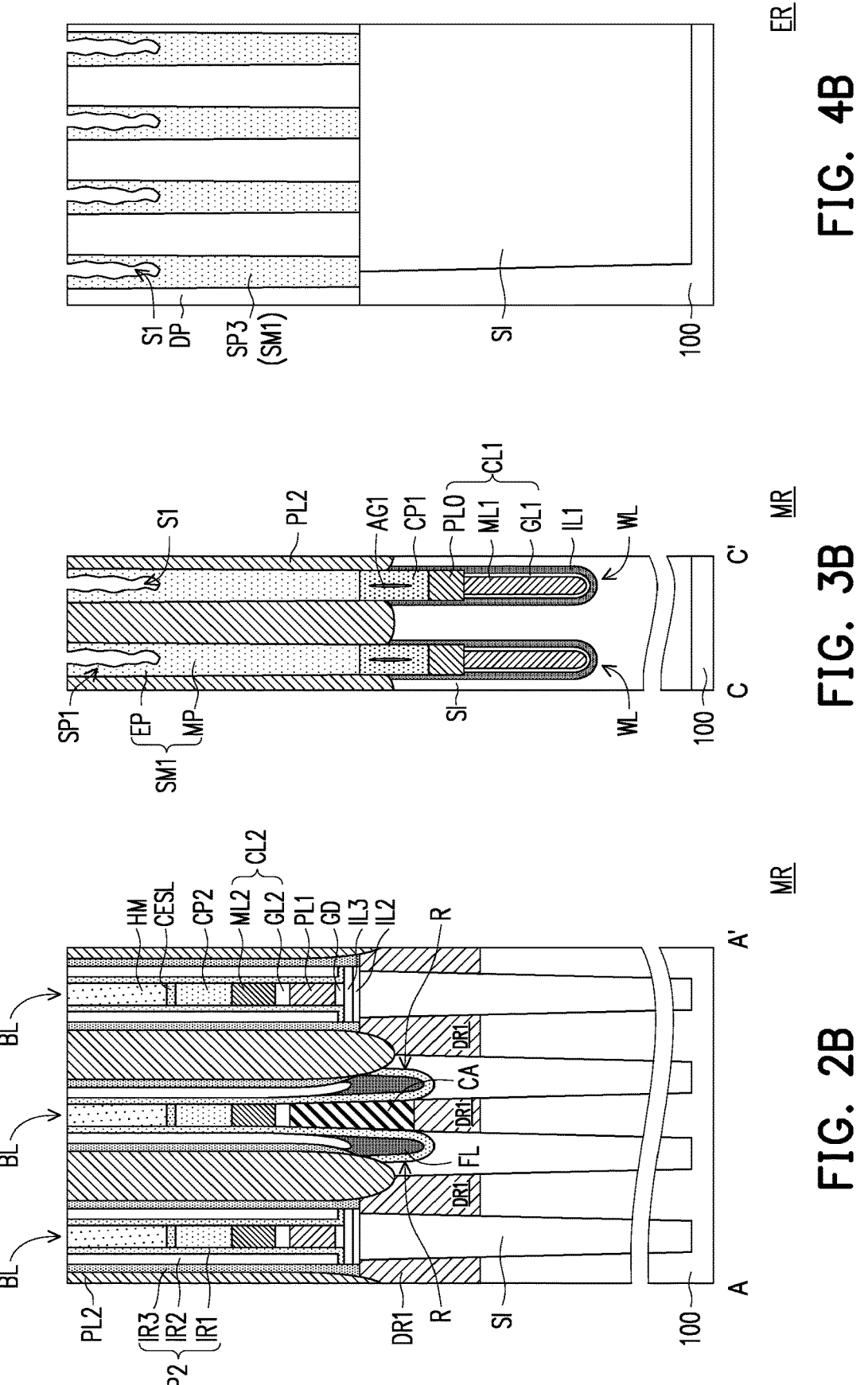

Referring to FIGS. 2B and 3B, an etching process (such as wet etching process) is performed to remove a portion of the node contact material PL2 to expose the hard mask layer HM. Afterwards, the etching process continues to remove the tops of the spacers SP1, SP2, and SP3, so as to expose the spacers SP1 and SP3 inside the seam S1. The etching process may be a wet etching process, and the etchant may be hot phosphoric acid.

Figures 2C, 3C, 4C:
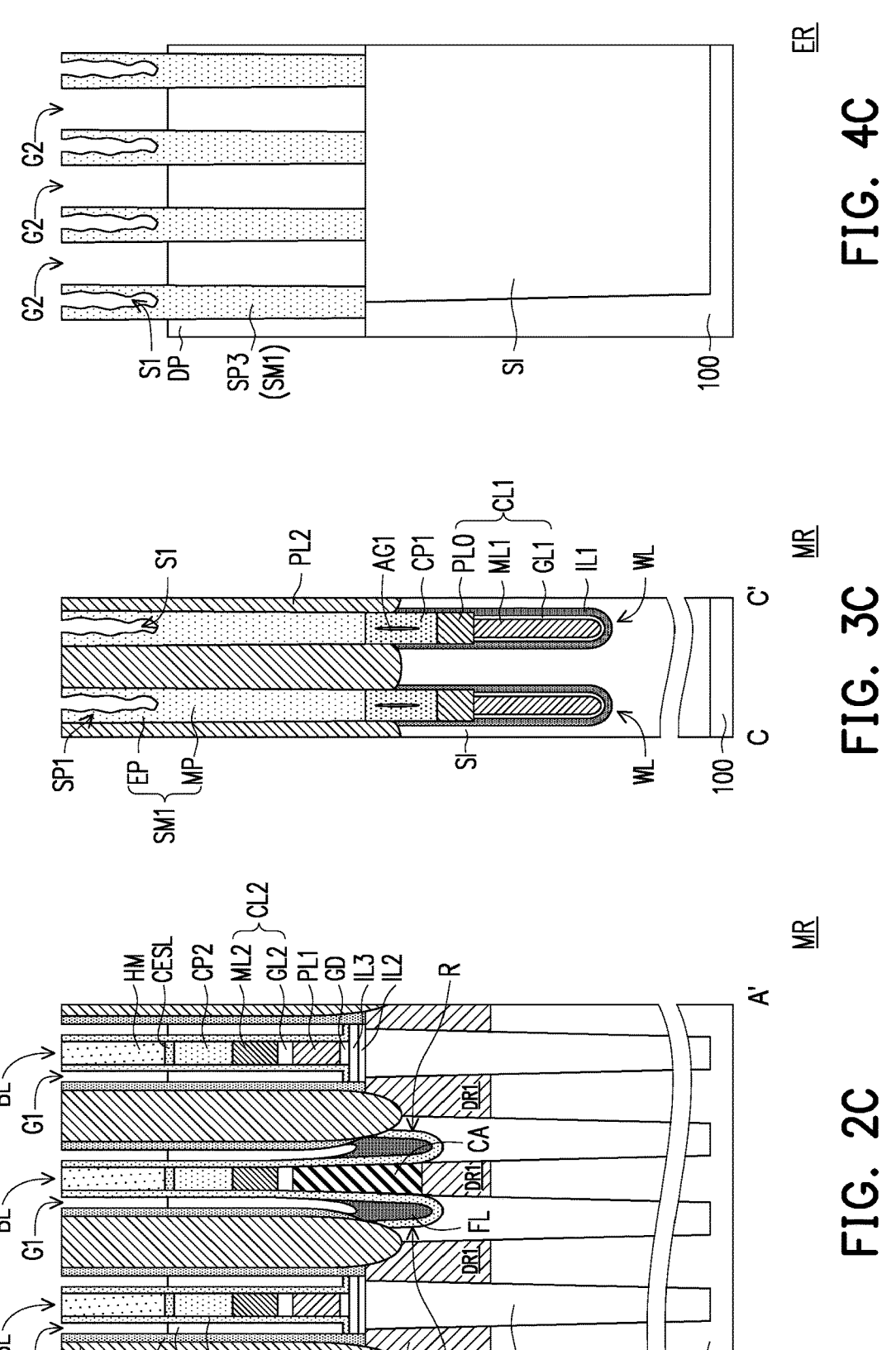

Referring to FIGS. 1, 2C to 4C, another etching process is carried out to remove the upper part of the middle liner layer IR2, so as to form a groove G1 extending in the direction D2. During the etching process, the dielectric pillars DP in the end region ER are also etched, so as to form grooves G2 as shown in FIG. 4C. The etching process may be a wet etching process, and the etchant used may be hydrofluoric acid.

Figures 2D, 3D, 4D:
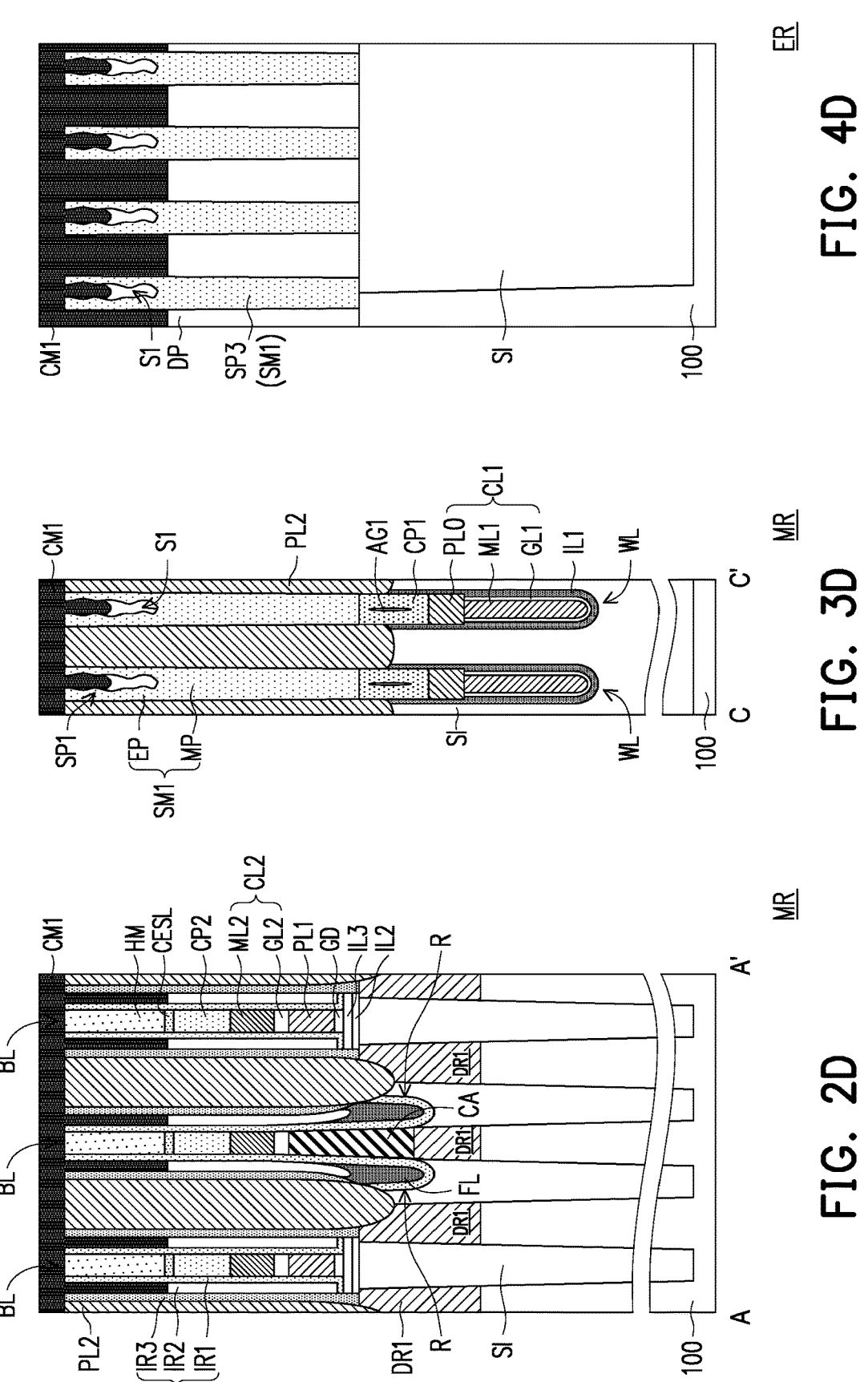
Figure 4E:
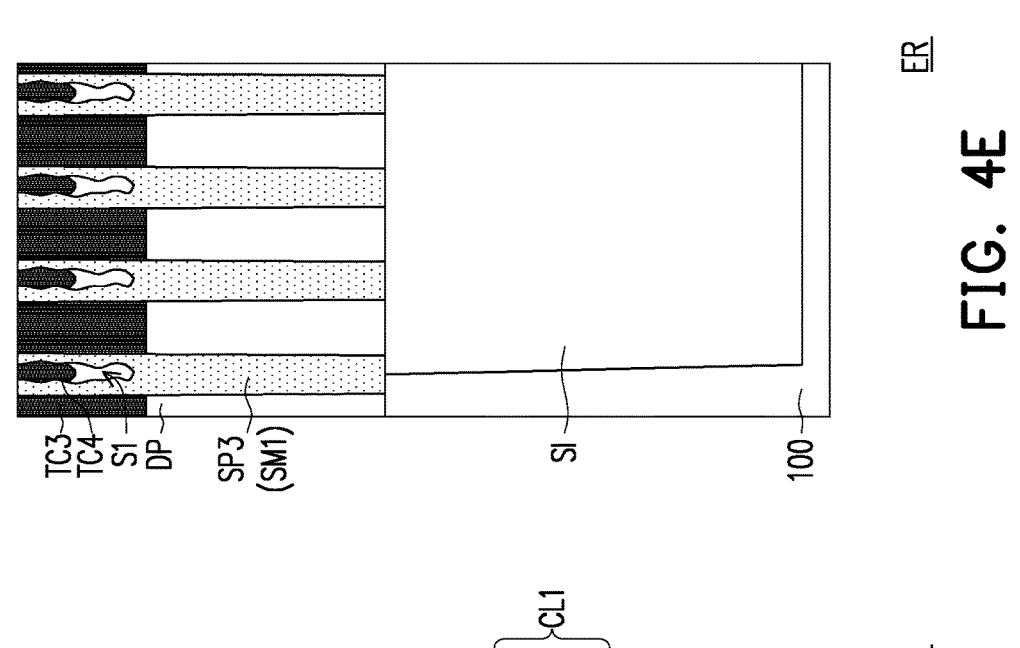

Referring to FIGS. 1, 2D and 3D, a cap material CM1 is formed on the substrate 100 and filled into the grooves G1, G2 and the seam S1. The cap material CM1 may completely or incompletely fill the grooves G1, G2 and the seam S1, but at least the top of the seam S1 is sealed and has a sufficient thickness on the middle liner layer IR2. The cap material CM1 is different from the middle liner layer IR2, and for example, may be silicon nitride.

Figure 3E:
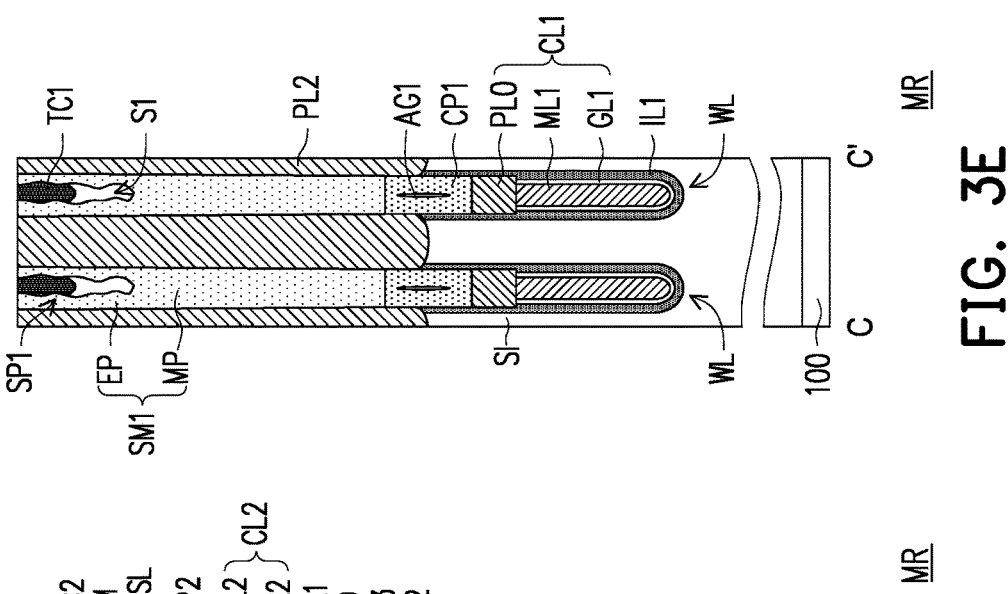
Figure 2E:
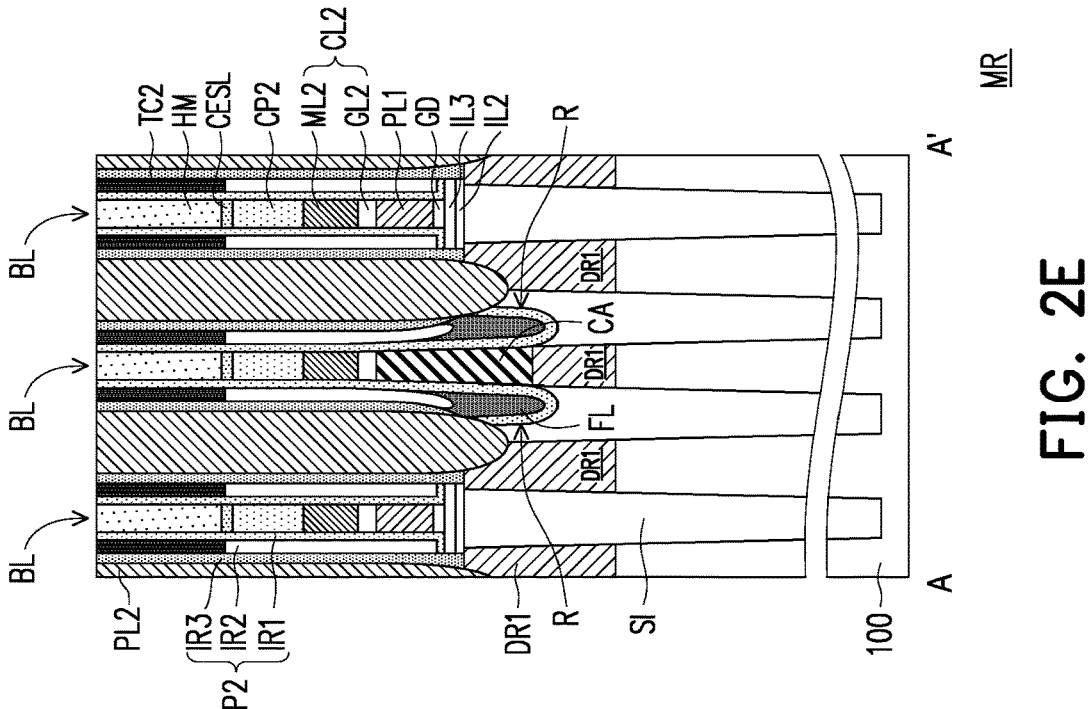

Referring to FIGS. 1, 2E, and 3E, an etching process is performed to remove the cap material CM1 on the node contact material PL2, and to form cap layers TC1, TC4 and TC2, TC3 respectively in the seams S1 of the spacers SP1 and SP3, and in the grooves G1, G2. In some embodiments, the cap layer TC1 is embedded in the extension portion EP of the spacer SP1 without fully filling the seam S1 of the spacer SP1. The cap layer TC2 is located above the middle liner layer IR2 and is sandwiched between the liner layers IR1 and IR3 together with the middle liner layer IR2. The cap layer TC3 is located on the dielectric pillar DP. The cap layer TC4 is embedded in the extension portion EP of the spacer SP3 without fully filling the seam S1 of the spacer SP3.

Figures 2F, 3F, 4F:
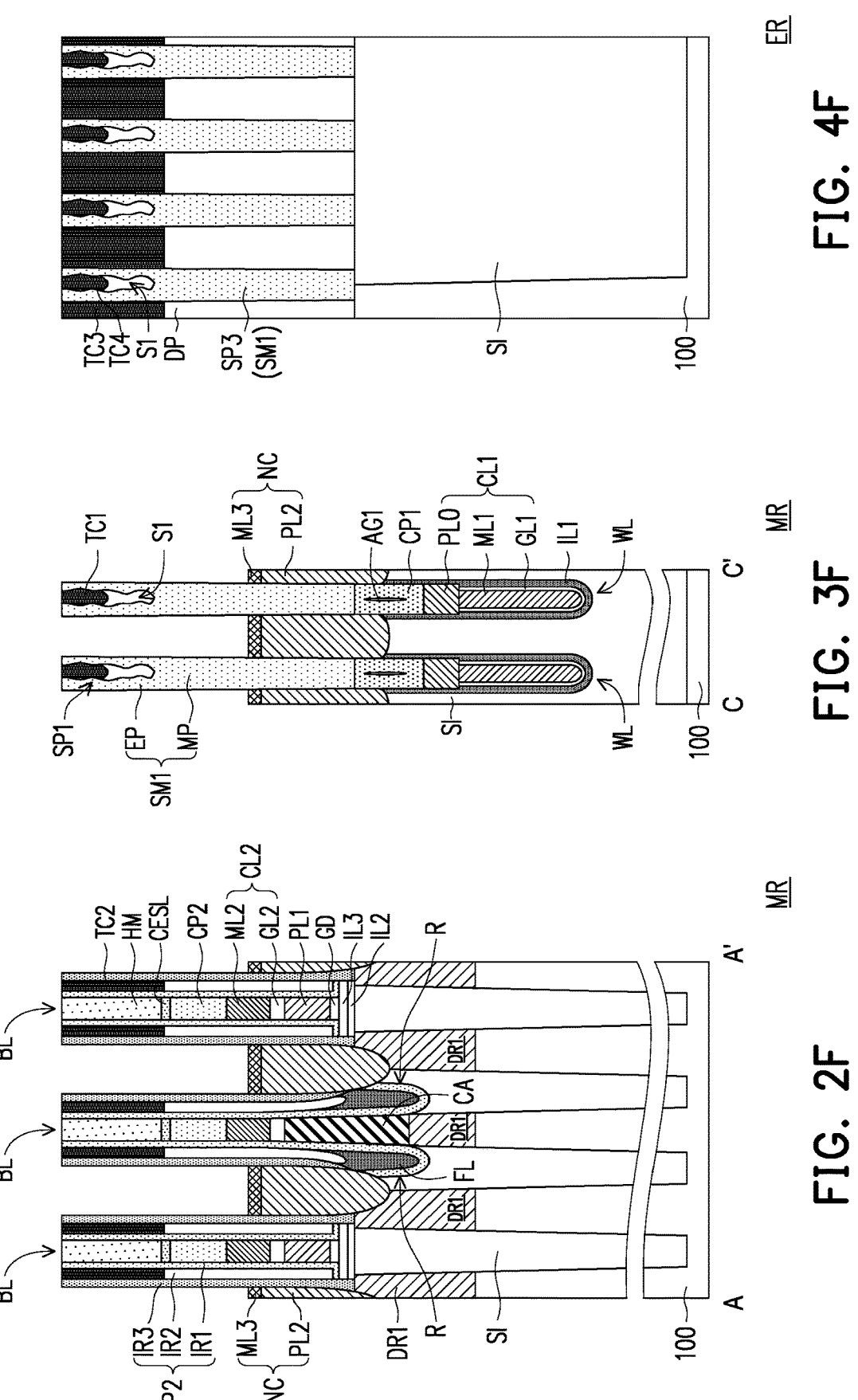
Figures 2G, 3G, 4G:
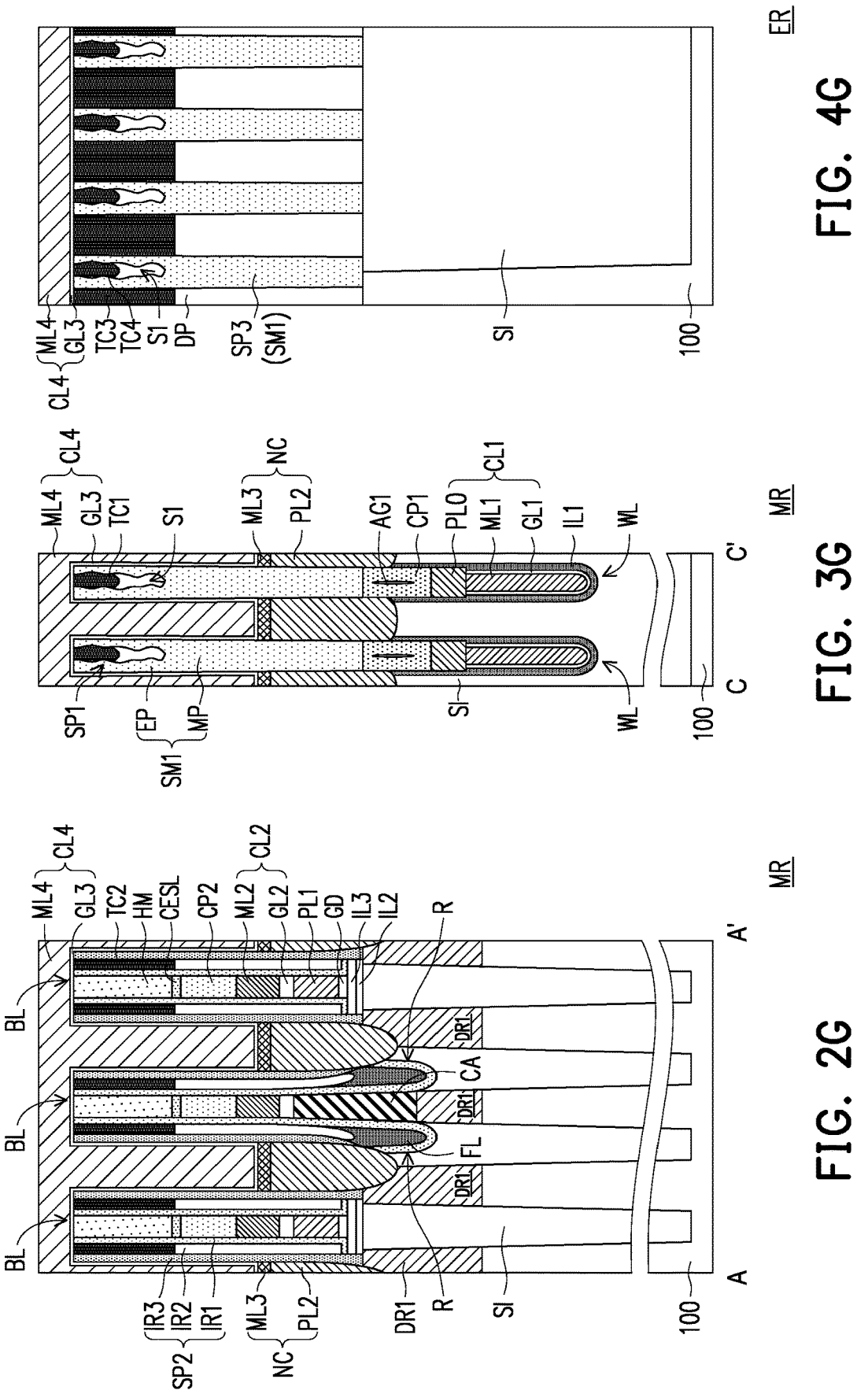
Figures 2H, 3H, 4H:
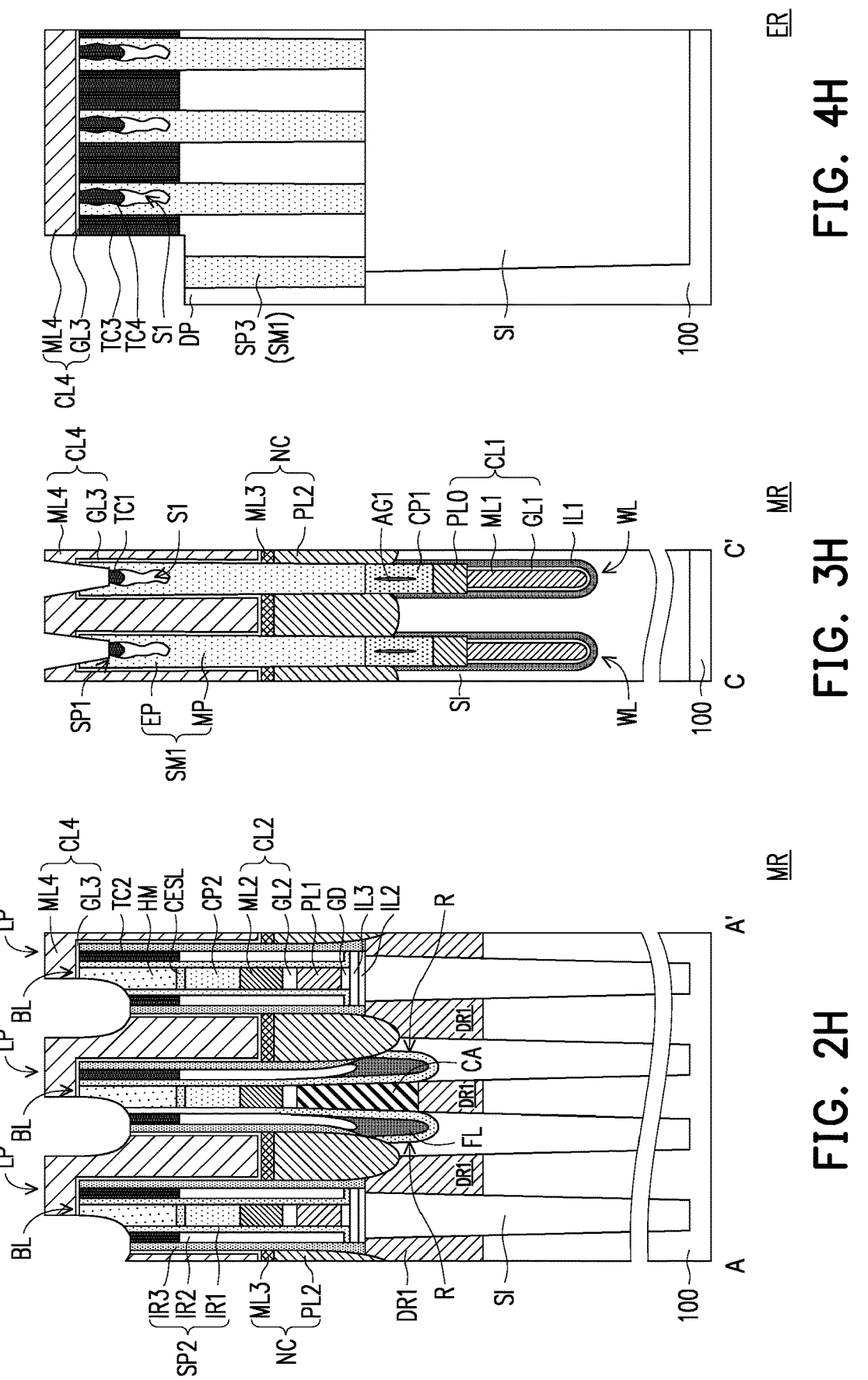

Referring to FIG. 1, 2F and FIG. 3F, a anisotropic etching process is performed to remove a portion of the node contact material PL2. Afterwards, an optional self-alignment metal silicide process may be performed to form metal silicide ML3, such as cobalt silicide. The node contact material PL2 and the metal silicide ML3, form a node contact window NC.

Referring to FIGS. 1 and 2G to 4G, a conductor layer CL4 is formed above the substrate 100. The conductor layer CL4 comprises a barrier layer GL3 and a metal layer ML4. The material of the barrier layer GL3 may be titanium, titanium nitride, tantalum, niobium nitride, or a combination thereof. The material of the metal layer ML4 may be tungsten. Since the top of the seam S1 is completely sealed by the cap layer TC1, the barrier layer GL3 will not fall into the seam S1.

Referring to FIGS. 1, 2H to 4H, lithography and etching processes is performed to pattern the conductor layer CL4, so as to form a capacitor landing pad LP. The capacitor landing pad LP is formed on and electrically connected to the node contact window NC. The capacitor landing pad LP overlaps with a portion of the node contact window NC, as well as a portion of the spacer SP2 and the hard mask layer HM of the bit line structure BL. Since the barrier layer GL3 does not fall into the seam S1, the capacitor landing pads LP are electrically isolated from each other. Since the cap layer TC2 has a sufficient thickness to protect the underlying middle liner layer IR2 from etching damage during the etching process, it avoids the profile of the bit line structure BL from being damaged and thus avoids electrical issues.

Referring to FIG. 1, a capacitor C is formed on the capacitor landing pad LP. The capacitor C is electrically connected to the doped region DR1 in the substrate 100 through the capacitor landing pad LP and the node contact window NC.

In summary, in the present embodiment of the disclosure, the spacerseam in the spacers on the sidewalls of adjacent two adjacent node contacts may be exposed by an etching process first, and then filled with the capping layer to seal the seam, thereby avoiding bridging problems caused by subsequent obstruction or conductor layers filling the steam. In addition, the middle liner of the spacerspacer on the sidewall of the bit line structure is covered with a capping layer can prevent the middle liner from being damaged by etchant during the etching process, thereby avoiding damage to the profile of the bit line structure BL and resulting electrical problems.

It will be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A dynamic random access memory comprising:
a plurality of word line structures, located in a substrate;
a plurality of bit line structures, located over the substrate, spanning over the plurality of word line structures;
a plurality of node contacts, each of which being located between adjacent two of the word line structures and adjacent two of the bit line structures;
a plurality of first spacers, separating the plurality of node contacts,
wherein each of the plurality of first spacers further comprises:
spacer material, filled in a gap between the node contacts that are adjacent; and
a first cap layer, embedded in the spacer material; and
a plurality of second spacers, located on a plurality of sidewalls of the plurality of bit line structures,
wherein each of the plurality of second spacers comprises:
an inner liner layer, located on a sidewall of the corresponding bit line structure;
a middle liner layer, located on a lower sidewall of the inner liner layer;
a second cap layer, located on an upper sidewall of the inner liner layer; and
an outer liner layer, wherein the middle liner layer and the second cap layer are sandwiched between the inner liner layer and the outer liner layer.

2. The dynamic random access memory according to claim 1, wherein the spacer material comprises:
a main portion; and
an extension portion, located on the main portion and connected to the main portion, wherein the first cap layer is located in the extension portion.

3. The dynamic random access memory according to claim 1, wherein a seam is provided between the spacer material and the first cap layer.

4. The dynamic random access memory according to claim 3, wherein the seam has an irregular shape.

5. The dynamic random access memory according to claim 3, wherein the seam is higher than the plurality of node contacts.

6. The dynamic random access memory according to claim 1, wherein a material of the first cap layer comprises silicon nitride.

7. The dynamic random access memory according to claim 1, further comprising:
a plurality of dielectric pillars, arranged on an isolation structure at an end region of the substrate, the end region being adjacent to a memory cell region;
a plurality of third spacers, arranged on sidewalls of the plurality of dielectric pillars;
a plurality of third cap layers, located on the plurality of dielectric pillars; and
a plurality of fourth cap layers, embedded in the plurality of third spacers.

8. A method for manufacturing the dynamic random access memory of claim 1, comprising:

forming the plurality of word line structures in the substrate;

forming the plurality of bit line structures above the substrate;

forming a plurality of node contact materials, wherein each of the plurality of node contact material is located between adjacent two of the word line structures and adjacent two of the bit line structures;

forming the plurality of spacer materials between the plurality of node contact materials, wherein the plurality of spacer materials have a plurality of seams;

performing a removal step to remove a portion of the plurality of spacer materials to expose the plurality of seams;

forming the plurality of first cap layers in the plurality of seams, wherein the remained plurality of spacer materials forms a plurality of first spacers, and the plurality of first cap layers are embedded in the plurality of first spacers; and removing a portion of the plurality of node contact materials to form the plurality of node contacts.

9. The method according to claim 8, wherein a material of the plurality of first layers comprises silicon nitride.

10. The method according to claim 8, wherein forming the plurality of first cap layers comprises:

forming cap materials on the plurality of node contact materials and the plurality of bit line structures, and filling in the plurality of seams; and removing a portion of the cap materials to form the plurality of first cap layers.

11. The method according to claim 10, wherein the plurality of first cover materials are not fully filled in the plurality of seams.

12. The method according to claim 10, further comprising:

forming a plurality of second spacers on a plurality of sidewalls of the plurality of bit line structures, wherein each of the second spacers comprises:

an inner liner layer, located on a sidewall of a corresponding bit line structure, a middle liner layer, located on a sidewall of the inner lining layer, and an outer liner layer, wherein the middle liner layer is sandwiched between the inner liner layer and outer liner layer.

13. The method according to claim 12, wherein the removal step further comprises:

removing a portion of the plurality of second spacers.

14. The method according to claim 13, further comprising:

removing a portion of the middle liner layer to form a groove; and forming a second cap layer in the groove.

15. The method according to claim 14, wherein the cap material is also filled into the groove to form the second cap layer.

* * * * *